United States Patent
Lee et al.

(10) Patent No.: US 9,397,274 B2
(45) Date of Patent: Jul. 19, 2016

(54) LIGHT EMITTING DEVICE PACKAGE

(75) Inventors: Gun Kyo Lee, Seoul (KR); Nak-Hun Kim, Seoul (KR); Sun Mi Moon, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 624 days.

(21) Appl. No.: 13/412,813

(22) Filed: Mar. 6, 2012

(65) Prior Publication Data

US 2013/0049045 A1 Feb. 28, 2013

(30) Foreign Application Priority Data

Aug. 24, 2011 (KR) .................. 10-2011-0084315
Sep. 2, 2011 (KR) .................. 10-2011-0089263

(51) Int. Cl.
| | |
|---|---|
| H01L 33/60 | (2010.01) |
| H01L 33/54 | (2010.01) |
| H01L 33/48 | (2010.01) |
| H01L 33/50 | (2010.01) |
| H01L 33/44 | (2010.01) |
| H01L 33/62 | (2010.01) |

(52) U.S. Cl.
CPC ............. *H01L 33/54* (2013.01); *H01L 33/486* (2013.01); *H01L 33/505* (2013.01); *H01L 33/44* (2013.01); *H01L 33/62* (2013.01); *H01L 2224/48091* (2013.01); *H01L 2224/49107* (2013.01)

(58) Field of Classification Search
USPC .......................................................... 257/98
See application file for complete search history.

(56) References Cited

U.S. PATENT DOCUMENTS

| | | | |
|---|---|---|---|
| 2008/0012036 A1* | 1/2008 | Loh et al. ................. | 257/99 |
| 2008/0068845 A1 | 3/2008 | Aida et al. | |
| 2009/0197360 A1* | 8/2009 | Han et al. ................. | 438/26 |
| 2010/0091504 A1* | 4/2010 | Lee et al. ................. | 362/373 |
| 2010/0102345 A1* | 4/2010 | Kong et al. ............... | 257/98 |
| 2010/0237376 A1* | 9/2010 | Choi ......................... | 257/98 |
| 2011/0001161 A1* | 1/2011 | Park et al. ................. | 257/98 |
| 2011/0127903 A1 | 6/2011 | Yao et al. | |
| 2011/0260199 A1* | 10/2011 | Andrews .................. | 257/99 |
| 2011/0284885 A1* | 11/2011 | Hong ........................ | 257/88 |
| 2012/0132931 A1* | 5/2012 | Inoue et al. ............... | 257/88 |

FOREIGN PATENT DOCUMENTS

| | | |
|---|---|---|
| CN | 1822365 A | 8/2006 |
| CN | 101997074 A | 3/2011 |
| CN | 102097423 A | 6/2011 |

(Continued)

*Primary Examiner* — Telly Green
*Assistant Examiner* — Damian A Hillman
(74) *Attorney, Agent, or Firm* — Birch, Stewart, Kolasch & Birch, LLP

(57) ABSTRACT

Embodiments disclose a light emitting device package including an insulating layer, a first lead frame and a second lead frame disposed on the insulating layer electrically separate from each other, a light emitting device disposed on the second lead frame electrically connected to the first lead frame and the second lead frame, the light emitting device includes a light emitting structure having a first conduction type semiconductor layer, an active layer, and a second conduction type semiconductor layer and a lens which encloses the light emitting device, wherein the insulating layer has an end portion projected beyond at least one of an end portion of the first lead frame and an end portion of the second lead frame, to form an opened region which exposes the insulating layer.

19 Claims, 14 Drawing Sheets

(56) References Cited

FOREIGN PATENT DOCUMENTS

| EP | 1 693 904 A2 | 8/2006 |
| EP | 2 323 183 A1 | 5/2011 |
| WO | WO 2008/018336 A1 | 2/2008 |
| WO | WO 2010/091967 A1 | 8/2010 |

* cited by examiner

LIGHT EMITTING DEVICE PACKAGE

CROSS REFERENCE TO RELATED APPLICATION

This application claims priority under 35 U.S.C. §119 to Korea Application No. 10-2011-0084315 filed in Korea on August 2011, and to Korea Application No. 10-2011-0089263 filed in Korea on 2 Sep. 2011 which are hereby incorporated in their entirety by reference as if fully set forth herein.

TECHNICAL FIELD

Embodiments relate to a light emitting device package and lighting system including the same.

BACKGROUND

The light emitting device, such as a light emitting diode of a III-V group or II-VI group compound semiconductor or a laser diode, can produce various colors, such as red, blue, and ultra-violet owing to development of the epitaxial growth technology and device materials therefor, as well as a white color of good efficiency by using a fluorescent material or by combination of colors.

Accordingly, application of the light emitting device is expanding even to transmission modules of optical communication means, a light emitting diode back light unit which is replacing the CCFL (Cold Cathode Fluorescence Lamp) back light unit in an LCD (Liquid Crystal Display) device, white light emitting diode lighting devices, car head lights, and signal lamps.

The light emitting device is mounted to a package body to construct a light emitting device package. The light emitting device package is provided with the package body of silicon or PPA resin, one pair of lead frames mounted to the package body, and the light emitting device on the lead frames connected thereto, electrically.

SUMMARY

In one embodiment, a light emitting device package includes an insulating layer, a first lead frame and a second lead frame disposed on the insulating layer electrically separate from each other, a light emitting device disposed on the second lead frame electrically connected to the first lead frame and the second lead frame, the light emitting device includes a light emitting structure having a first conduction type semiconductor layer, an active layer, and a second conduction type semiconductor layer, and a lens which encloses the light emitting device, wherein the insulating layer has an end portion projected beyond at least one of an end portion of the first lead frame or an end portion of the second lead frame.

An edge of the lens may be disposed on the opened region of the insulating layer.

The edge of the lens may be in direct contact with the insulating layer at the opened region.

The insulating layer may be projected 90 μm to 110 μm from at least one of the end portion of the first lead frame or the end portion of the second lead frame.

The light emitting device package may further include a reflective layer disposed on at least one of the first lead frame or the second lead frame.

The insulating layer may comprise at least one of polyimide or PPA.

The second lead frame may have a concave part disposed at a region having the light emitting device disposed thereto.

In another embodiment, a light emitting device package includes, an insulating layer, a first lead frame and a second lead frame disposed on the insulating layer electrically separated from each other, a light emitting device arranged on the second lead frame electrically connected to the first lead frame and the second lead frame, the light emitting device includes a light emitting structure having a first conduction type semiconductor layer, an active layer, and a second conduction type semiconductor layer, a resin layer disposed on the light emitting device, the resin layer including a fluorescent material, a lens disposed on the resin layer, and a polymer protective film having at least a portion thereof disposed between the lens and the insulating layer.

The light emitting device package may further includes a reflective layer disposed on the first lead frame and the second lead frame, and the polymer protective film is disposed between the reflective layer and the lens.

The polymer protective film may be disposed in contact with at least one side of the reflective layer, the lead frame, or the insulating layer.

The polymer protective film may be disposed between at least one of the first lead frame or the second lead frame on the insulating layer and the lens.

The polymer protective film may include at least one of solder resist or PPA.

The light emitting device package may further include a concave part disposed on the second lead frame, and the light emitting device is disposed on the concave part.

The concave part may not overlap with the insulating layer.

The concave part may be a down-set region of the second lead frame.

The light emitting device package may further include a groove disposed on the second lead frame around the light emitting device, and an edge of the resin layer is disposed at the groove.

In a further embodiment, a lighting system includes a light emitting device package including an insulating layer, a first lead frame and a second lead frame disposed on the insulating layer electrically separate from each other, a light emitting device disposed on the second lead frame electrically connected to the first lead frame and the second lead frame, the light emitting device includes a light emitting structure having a first conduction type semiconductor layer, an active layer, and a second conduction type semiconductor layer, and a lens which encloses the light emitting device, wherein a protective film is disposed at an edge of the lens, a circuit board electrically connected to the first lead frame and the second lead frame, and an optical member disposed on a light emitting path of the light emitting device and transmitting a light from the light emitting device.

The insulating layer may have an end portion projected beyond at least one of an end portion of the first lead frame or an end portion of the second lead frame.

The polymer protective film may include at least one of solder resist or PPA.

The lighting system may further includes a reflective layer disposed on the first lead frame and the second lead frame, and the protective film is disposed at least one of between the reflective layer and the lens, or between the reflective layer and the insulating layer.

BRIEF DESCRIPTION OF THE DRAWINGS

Arrangements and embodiments may be described in detail with reference to the following drawings in which like reference numerals refer to like elements and wherein.

DETAILED DESCRIPTION

Hereinafter, embodiments will be described with reference to the annexed drawings.

It will be understood that, when an element is referred to as being 'on' or "under" another element, it can be directly on/under the element, and one or more intervening elements may also be present. When an element is referred to as being 'on' or 'under', 'under the element' as well as 'on the element' can be included based on the element.

Figure 1:
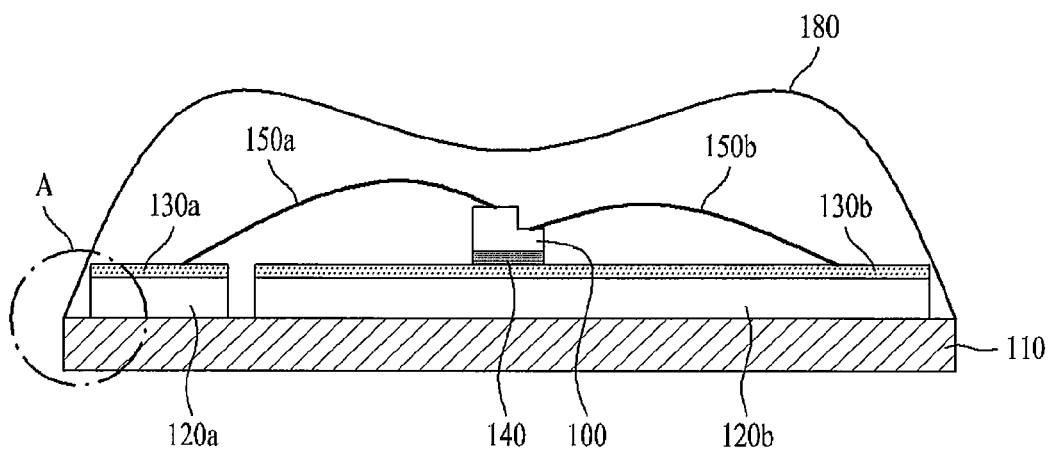
FIG. 1 illustrates a section of a light emitting device package in accordance with a first embodiment.
Figure 2:
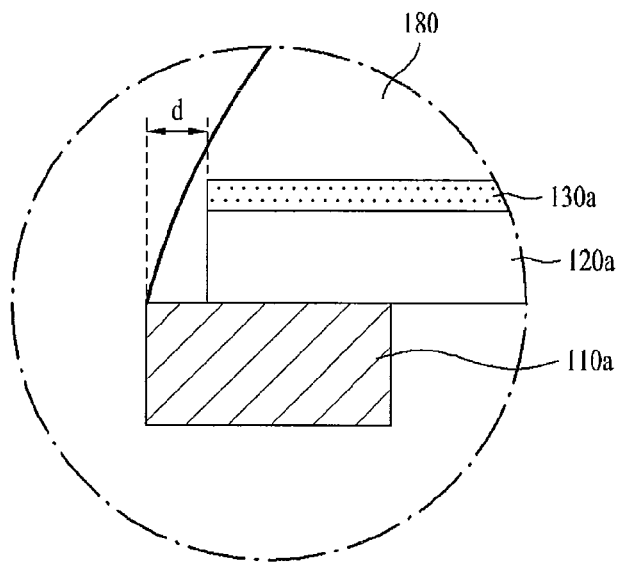
FIG. 2 illustrates an enlarged view of the 'A' part in FIG. 1.

FIG. 1 illustrates a section of a light emitting device package in accordance with a first embodiment, and FIG. 2 illustrates an enlarged view of the 'A' part in FIG. 1.

Referring to FIGS. 1 and 2, the light emitting device package includes an insulating layer 110, one pair of lead frames 120a and 120b disposed on the insulating layer 110 electrically separate from each other, a light emitting device 100 disposed opposite to the insulating layer 110 with respect to the one pair of lead frames 120a and 120b respectively connected to the one pair of lead frames 120a and 120b, and a lens which encloses the light emitting device 100.

The light emitting device 100 is disposed on the second lead frame 120b. Since the second lead frame 120b is fabricated in a fabrication process the same with the first lead frame 120a, the second lead frame 120b is formed of a conductive material, but the second lead frame 120b may be formed of a non-conductive material.

In these embodiments or other embodiments, the light emitting device 100 may be semiconductor light emitting device, for example light emitting diode.

The first and second lead frames 120a and 120b are formed of the conductive material, for an example, copper Cu, but separated electrically. The first and second lead frames 120a and 120b may be spaced 20 to 40 µm from each other. And, the first and second lead frames 120a and 120b may be formed of identical material separated from each other, electrically.

The first and second lead frames 120a and 120b may be formed of, for an example, copper Cu each at a thickness of 30 to 40 w. If the thickness each of the first and second lead frames 120a and 120b is too thin, a function of supporting the light emitting device 100 and so on may be inadequate, and, if the thickness of each of the first and second lead frames 120a and 120b is too thick, the too thick thicknesses of the first and second lead frames 120a and 120b may become a cause of thickness and mass increase of the light emitting device package.

Since the first and second lead frames 120a and 120b are supported by the insulating layer 110 at a region the first and second lead frames 120a and 120b are separated from each other, the insulating layer 110 is exposed.

The insulating layer 110 may be formed of an insulating material, such as polyimide, having good heat conductivity.

The insulating layer 110 may be formed at a thickness of 70 to 80 µm. If the thickness of the insulating layer 110 is too thin, a function of supporting the first and second lead frames 120a and 120b and so on may be inadequate, and, if the thickness of the insulating layer 110 is too thick, the too thick thickness of the insulating layer 110 may increase a thickness of the light emitting device package.

First and second reflective layers 130a and 130h are respectively disposed on the first and second lead frames 120a and 120b for reflecting a light from the light emitting device 100 to a front (Upper side in FIG. 1) of the light emitting device package to increase brightness.

The first and second reflective layers 130a and 130b are formed of a material having good reflectivity, for an example, a coat of silver Ag.

And, the light emitting device 100 is adhered to the second lead frame 120b with an adhesive layer 140 of a conductive or non-conductive material. The light emitting device 100 is connected to the first lead frame 120a and the second lead frame 120b with first and second wires 150a and 150b, electrically.

Though FIG. 1 illustrates the light emitting device 100 in contact with the second reflective layer 130b, the light emitting device 100 may be in direct contact with the second reflective layer 130b. Though FIG. 1 illustrates the first and second wires 150a and 150b in contact with the first and second reflective layers 130a and 130b, the first and second wires 150a and 150b may be in direct contact with the first lead frame 120a and the second lead frame 120b, respectively.

The lens 180 encloses the light emitting device 100 and the first and second wires 150a and 150b. Though not shown, a resin layer may be disposed to enclose the light emitting device 100 and the first and second wires 150a and 150b, and the resin layer may include a fluorescent material to change a wavelength of the light from the light emitting device 100.

The lens 180 is formed of a material having good light transmissivity, such as PMMA (PolyMethylMethAcrylate), PC (PolyCarbonate), and PE (PolyEthylene; PE), or injection molded resin.

A region matched to an edge of the lens 180, i.e., the insulating layer 110 is projected beyond the first lead frame 120a and the second lead frame 120b.

Referring to FIG. 1, a region in the 'A' part where the insulating layer 110 and the first lead frame 120a are coupled may be called as a 'coupled portion' which is best seen in FIG. 2. As shown in FIG. 2, though an edge of the lens 180 is matched with an edge of the insulating layer 110, the edge of the lens 180 may be positioned at an inner side of the insulating layer 110. A distance d from the edge of the lens 180 to the edge of the edge of the first lead frame 120a may be 90~110 μm. If the distance d is too short, a lens 180 sealing effect is liable to be low, and if too long, a size of the light emitting device package is liable to become larger.

The coupled portion may be positioned on an outside of the edge of the first lead frame 120a and on the insulating layer 110. In FIG. 1, the coupled portion at a right region may position at an outside of the second lead frame 120b. In this instance, the insulating layer 110 may be disposed projected 90~110 μm from the edge of the first lead frame 120a and the second lead frame 120b, respectively.

Though not shown, one pair of circuit boards may be disposed on an upper side of the first lead frame 120a and the second lead frame 120b for supplying a current to the light emitting device 100.

FIGS. 3 to 7 illustrate sections showing the steps of a method for fabricating the light emitting device package in FIG. 1 in accordance with an embodiment.

Figure 3:
FIGS. 3 to 7 illustrate sections showing the steps of a method for fabricating the light emitting device package in FIG. 1 in accordance with an embodiment.
Figure 4:

Referring to FIG. 3, an insulating layer 110 of polyimide is provided, and, as shown in FIG. 4, a conductive layer material 120 is disposed on the insulating layer 110 by laminating or the like. In this instance, the conductive layer material 120 is disposed such that an edge of the insulating layer 110 is projected beyond an edge of the conductive layer material 120.

Figure 5:
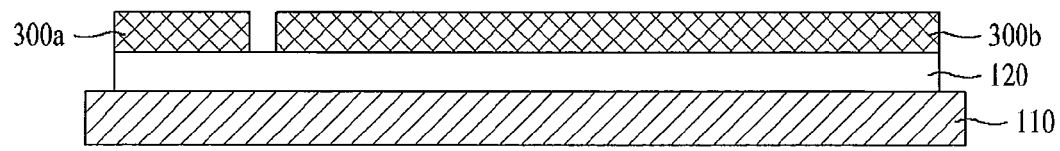

Referring to FIG. 5, the conductive layer material 120 is patterned to form first and second lead frames 120a and 120b by performing etching and isolation with photolithography.

Figure 6:

After the etching and isolation, referring to FIG. 6, the first and second frames 120a and 120b are patterned with masks 300a, and 300b.

Figure 7:
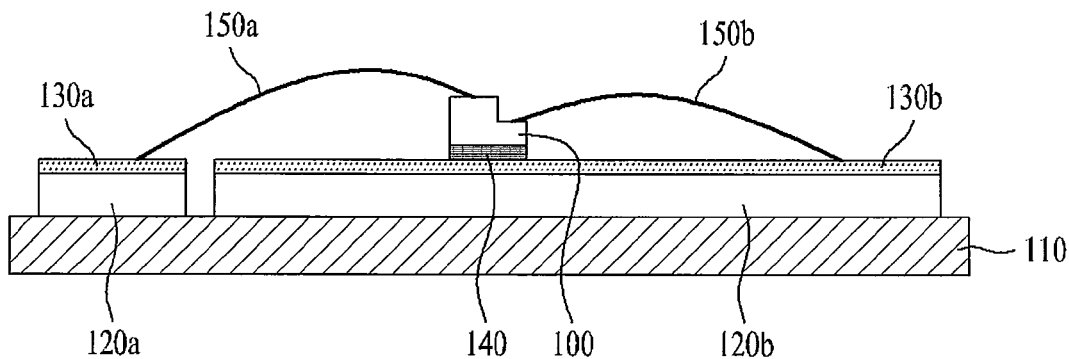

Referring to FIG. 7, reflective layers 130a and 130b are disposed on the first and second lead frames 120a and 120b by using plating of silver Ag or the like. And, a light emitting device 100 is bonded to the second lead frame 120b with an adhesive layer 140. And, the light emitting device 100 is connected to the first lead frame 120a and the second lead frame 120b with first and second wires 150a and 150b, electrically.

Figure 8:
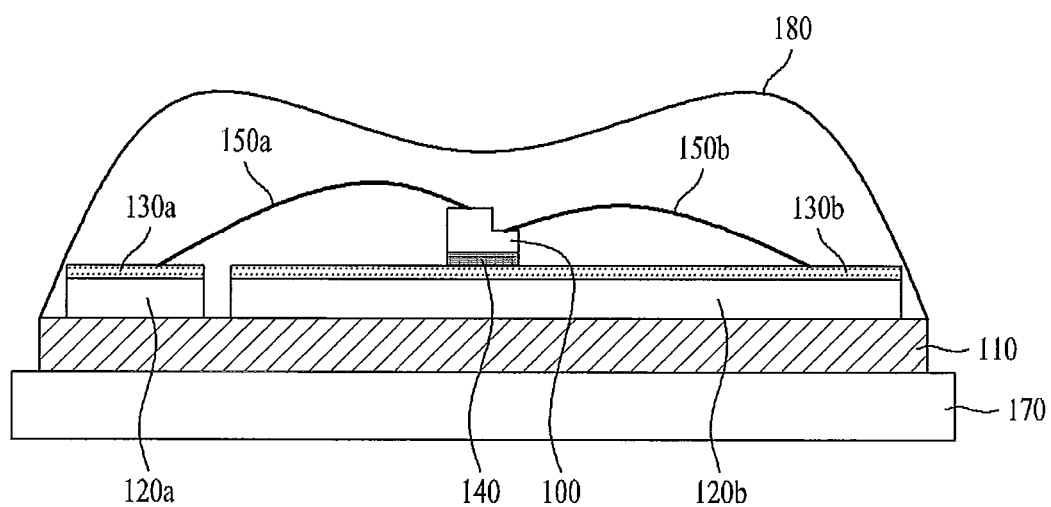
FIG. 8 illustrates a section showing a state in which a light emitting device package in FIG. 1 is coupled to a heat dissipation layer.

FIG. 8 illustrates a section showing a state in which a light emitting device package in FIG. 1 is coupled to a heat dissipation layer.

The heat dissipation layer 170 is formed of a material having good heat conductivity, such as aluminum Al, for dissipating heat from the light emitting device 100 downward through the heat dissipation layer 170 via the second lead frame 120b.

Though not shown, since circuit boards may be disposed on an upper side of the first and second lead frames 120a and 120b, and the heat from the circuit boards may be dissipated to an upper side in FIG. 8, the heat from the light emitting device 100 and the circuit boards can be respectively dissipated, smoothly. And, since a package body is omitted and the circuit boards are disposed on an upper side of the lead frames, a thickness of the light emitting device package may become thinner.

Figure 9:
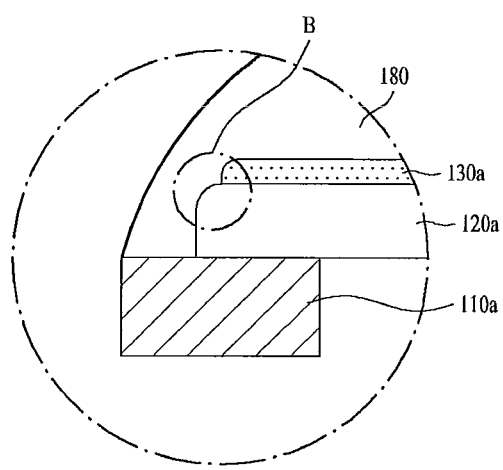
FIG. 9 illustrates an enlarged view showing an edge of the insulating layer in the light emitting device package in FIG. 1 in accordance with another embodiment.

FIG. 9 illustrates an enlarged view showing an edge of the insulating layer in the light emitting device package in FIG. 1 in accordance with another embodiment.

The embodiment suggests rounding of edge regions B of the first lead frame 120a and the first reflective layer 130a. And, an end of the lens 180 may not be matched with an end of the insulating layer 110.

Figure 10:
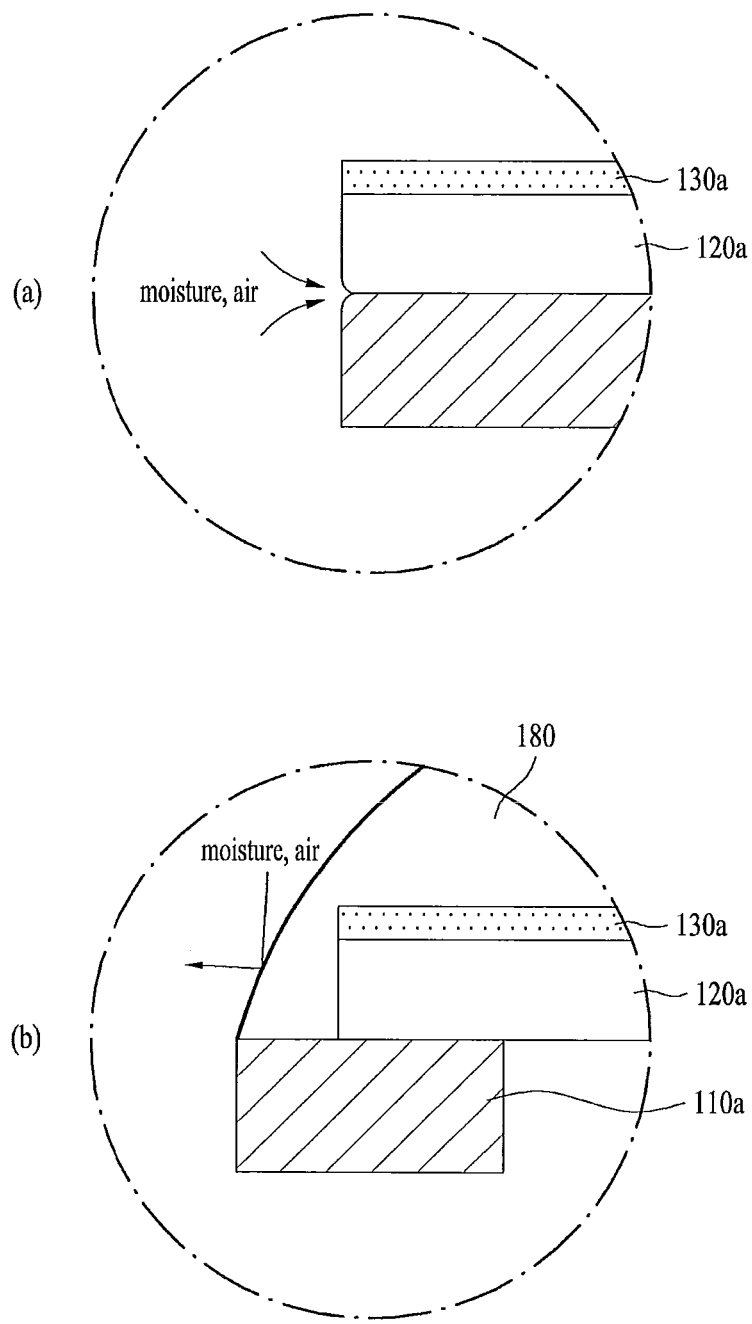
FIG. 10 illustrates an enlarged view showing an effect of the light emitting device package in FIG. 1.

FIG. 10 illustrates an enlarged view showing an effect of the light emitting device package in FIG. 1.

FIG. 10A illustrates an enlarged view of an edge of a related art light emitting device package showing that moisture or air may infiltrate through a gap between the insulating layer 110 and the first lead frame 120a.

FIG. 10B illustrates an enlarged view of an edge of a light emitting device package in accordance with an embodiment showing that, since the lens 180 seals a coupled region of the insulating layer 110 and the first lead frame 120a, the moisture or air can not infiltrate through a gap between the insulating layer 110 and the first lead frame 120a, thereby preventing performance of the light emitting device package from becoming poor.

That is, the light emitting device package in accordance with the embodiment has the insulating layer in contact with the first lead frame 120a and the second lead frame 120b. In this instance, since the insulating layer is projected further from a region of the contact, with the end of the lens disposed at a region of the projection such that the lens encloses and seals an adhered region of the insulating layer and the first and second lead frames 120a and 120b, infiltration of foreign matter thereto is prevented.

Figure 11:
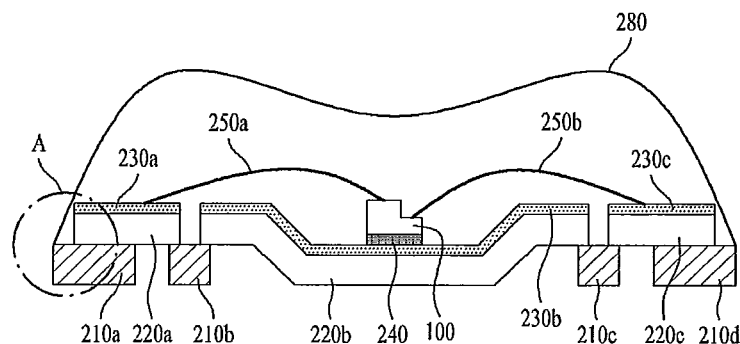
FIG. 11 illustrates a section of a light emitting device package in accordance with a second embodiment.
Figure 12:
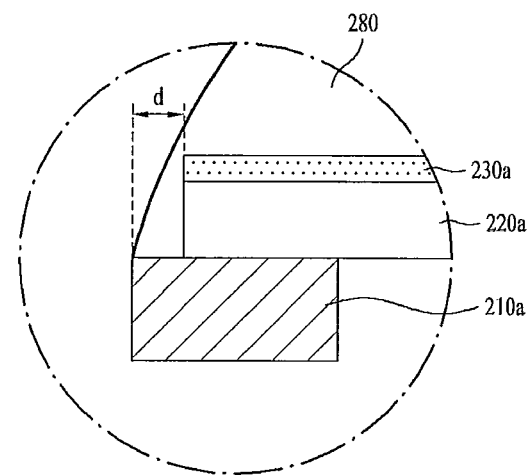
FIG. 12 illustrates an enlarged view of the 'A' part in FIG. 11.

FIG. 11 illustrates a section of a light emitting device package in accordance with a second embodiment, and FIG. 12 illustrates an enlarged view of the 'A' part in FIG. 11.

Referring to FIGS. 11 and 12, the light emitting device package has three lead frames 220a, 220b, and 220c, wherein the second and third lead frames 220b and 220c may be connected to each other, and the second lead frame 220 has a concave part having a light emitting device disposed therein.

The light emitting device package in accordance with the embodiment includes first to fourth insulating layers 210a to 210d, lead frames 220a, 220b, and 220c disposed on the first to fourth insulating layers 210a to 210d separate from one another electrically, a light emitting device 100 connected to one pair of the lead frames 220a and 220c disposed opposite to the first to fourth insulating layers 210a to 210d with respect to the lead frames 220a, 220b, and 220c, and a lens which encloses the light emitting device 100.

The light emitting device 100 is disposed over the third lead frame 220b, and the light emitting device 100 is disposed at the concave part of the third lead frame 220b. Since the third lead frame 220b is fabricated in a process the same with the first, and second lead frame 220a, and 220c, and formed of a conductive material the same with the first, and second lead frame 220a, and 220c, but, the lead frames may be formed of a non-conductive material.

The first and second lead frames 220a and 220c are formed of a conductive material, such as copper Cu, and separate from each other, electrically. And, since the first, and second lead frames 220a, and 220c are formed of a material the same with the third lead frame 220b in the fabrication process, it is required that the first, and second lead frames 220a, and 220, are separated from the third lead frame 220c electrically for preventing the third frame 220b from short circuiting to the first, and second lead frames 220a, and 220c.

The first to fourth insulating layers 210a to 210d are separated into at least two, wherein the third lead frame 220b may be separated taking the concave part as a boundary. And, the first insulating layer 210a and the second insulating layer 210b may not be separated from each other necessarily, and the third insulating layer 210c and the fourth insulating layer 210c may not be separated from each other, necessarily.

Since the first lead frame 220a and the third lead frame 220c are supported by the second insulating layer 210b at a region the first lead frame 220a and the third lead frame 220c are separated from each other, the second insulating layer 210b is exposed.

The first lead frame 220a and the third lead frame 220c may be spaced 20 to 40 µm from each other, and the second insulating layer 210b may be exposed as much as the space. The second lead frame 220b and the third lead frame 220c may be spaced 20 to 40 µm from each other, and the third insulating layer 210c may be exposed as much as the space. And, the third lead frame 220b may have a width of about 2.39 mm with 10% tolerance. Since the second lead frame 220c and the third lead frame 220b are supported by the third insulating layer 210c at a region the second lead frame 220c and the third lead frame 220b are separated from each other, the third insulating layer 210c is exposed. The first to fourth insulating layers 210a to 210d may be formed of an insulating material, such as polyimide. And, the first to fourth insulating layers 210a to 210d may be formed of a material having good heat conductivity.

The first, second, and third lead frames 220a, 220c, and 220b have the first, second, and the third reflective layers 230a, 230c, and 230b disposed thereon respectively, for reflecting a light from the light emitting device 100 toward a front side of the light emitting device package (Upper side in FIG. 11) for increasing brightness.

The first, second, and the third reflective layers 230a, 230c, and 230b are formed of a material having a good reflectivity, for an example, a coat of silver Ag.

And, the light emitting device 100 is adhered to the third lead frame 100 with an adhesive layer 230a, 230b of a conductive or non-conductive material. The light emitting device 100 is connected to the first, and second lead frames 220a, and 220c with first and second wires 100a and 100b, electrically.

Though FIG. 11 illustrates that the light emitting device 100 is in contact with the third reflective layer 230b, the light emitting device 100 may be in direct contact with the third lead frame 220b. Though FIG. 11 illustrates that the first and second wires 100a and 100b are in contact with the first, and second reflective layers 230a, and 230c, the first and second wires 100a and 100b may be in direct contact with the first, and second lead frames 220a, and 220c, respectively.

The lens 280 is disposed to enclose the light emitting device 100 and the first and second wires 100a and 100b. Though not shown, a resin layer (Not shown) may be molded to enclose the light emitting device 100 and the first and second wires 100a and 100b. The resin layer may include a fluorescent material to change a wavelength of the light from the light emitting device 100.

The lens 280 may be identical to the one described with reference to FIG. 1.

Referring to FIG. 12, though the lens 280 has an end matched with an end of the first insulating layer 210a, the lens 80 may have an edge positioned at an inner side of the first insulating layer 210a. A distance d between the edge of the first insulating layer 210a and the edge of the first lead frame 220a may be 90~110 µm. If the distance d is too short, a lens 280 sealing effect to be described later is not adequate, and if too long, a size of the light emitting device package may increase.

FIGS. 13 to 18 illustrate sections showing the steps of a method for fabricating the light emitting device package in FIG. 11 in accordance with an embodiment.

Figure 13:
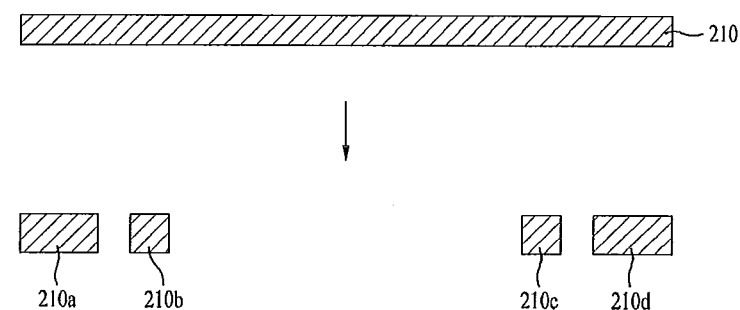
FIGS. 13 to 18 illustrate sections showing the steps of a method for fabricating the light emitting device package in FIG. 11 in accordance with an embodiment.

Referring to FIG. 13, polyimide 210 is patterned to form first to fourth insulating layers 210a to 210d by punching.

Figure 14:
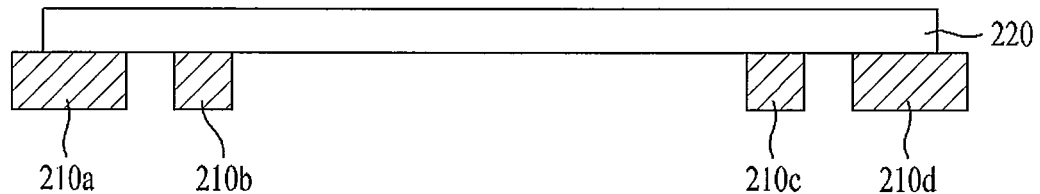
Figure 15:
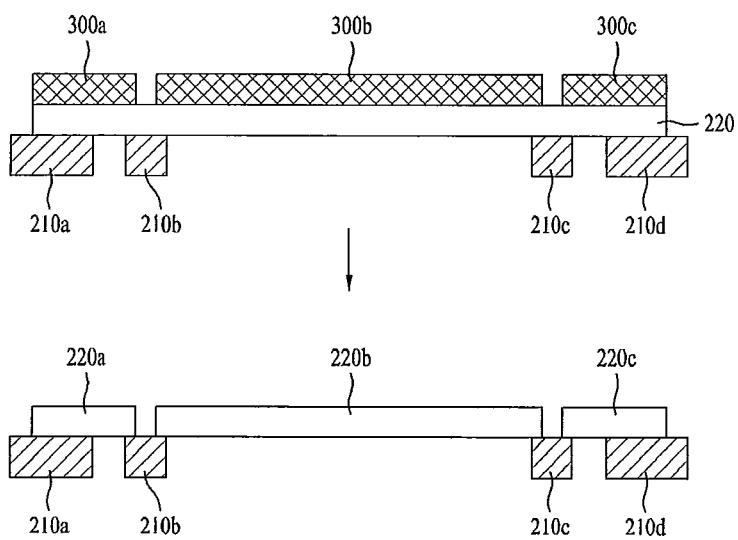
Figure 16:
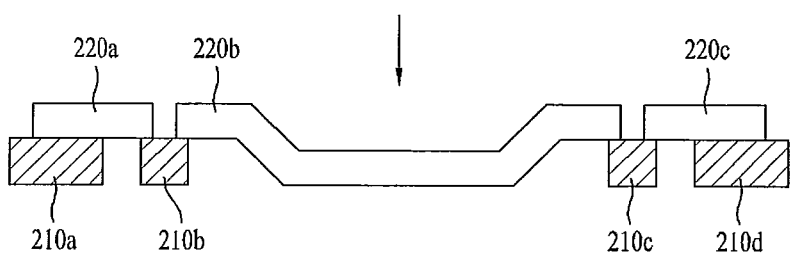

Referring to FIGS. 14 to 16, a conductive layer material 220 is laminated and patterned with masks 300a to 300c to form first to third lead frames 220a, 220c, and 220b.

Figure 17:
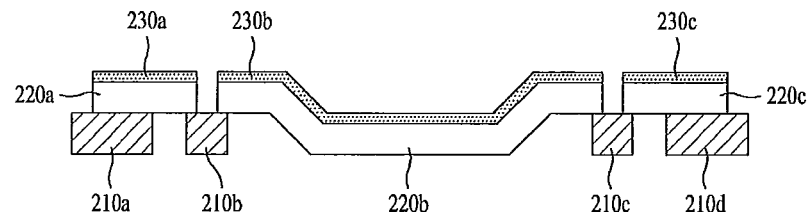

Referring to FIG. 17, a reflective layer is disposed on the first to third lead frames 220a to 220c by plating of silver Ag or the like.

Figure 18:
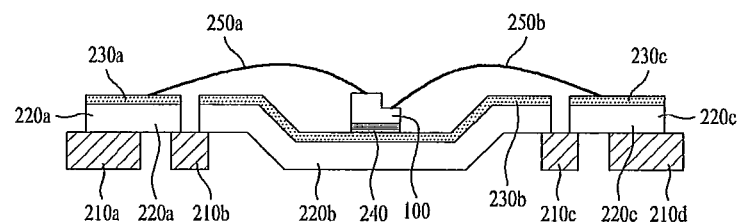

Referring to FIG. 18, a light emitting device 100 may be placed on the third lead frame 220b, and connected to the first, and second lead frames 220a, and 220c with first and second wires 100a and 205b electrically, and a lens (Not shown) may be disposed on the light emitting device 100.

Figure 19:
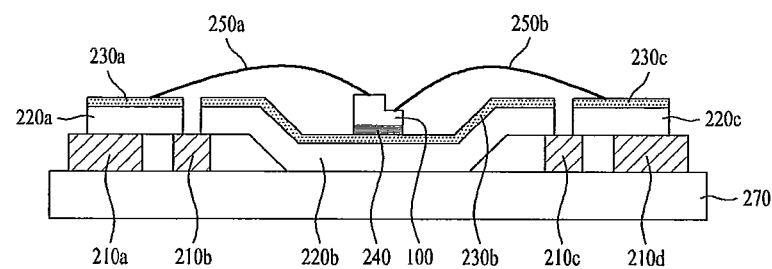
FIG. 19 illustrates a section showing a light emitting device package in FIG. 11 coupled with a heat dissipation layer.

FIG. 19 illustrates a section showing a light emitting device package in FIG. 11 coupled with a heat dissipation layer 270, and a function of the light emitting device package is the same with the description made with reference to FIG. 8. Alike the embodiment described before, the heat dissipation layer 270 may be formed of a material having good heat conductivity, such as copper Cu or aluminum Al.

And, a detailed structure and an effect of the insulating layer of the light emitting device package in FIG. 11 are the same with the light emitting device package described with reference to FIGS. 9 and 10.

Figure 20:
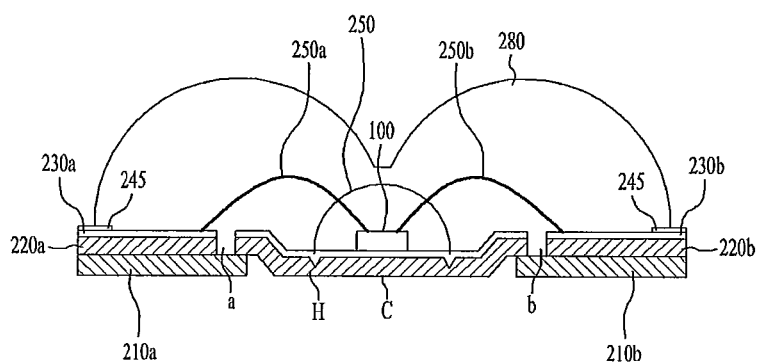
FIG. 20 illustrates a section of a light emitting device package in accordance with a third embodiment.
Figure 21:
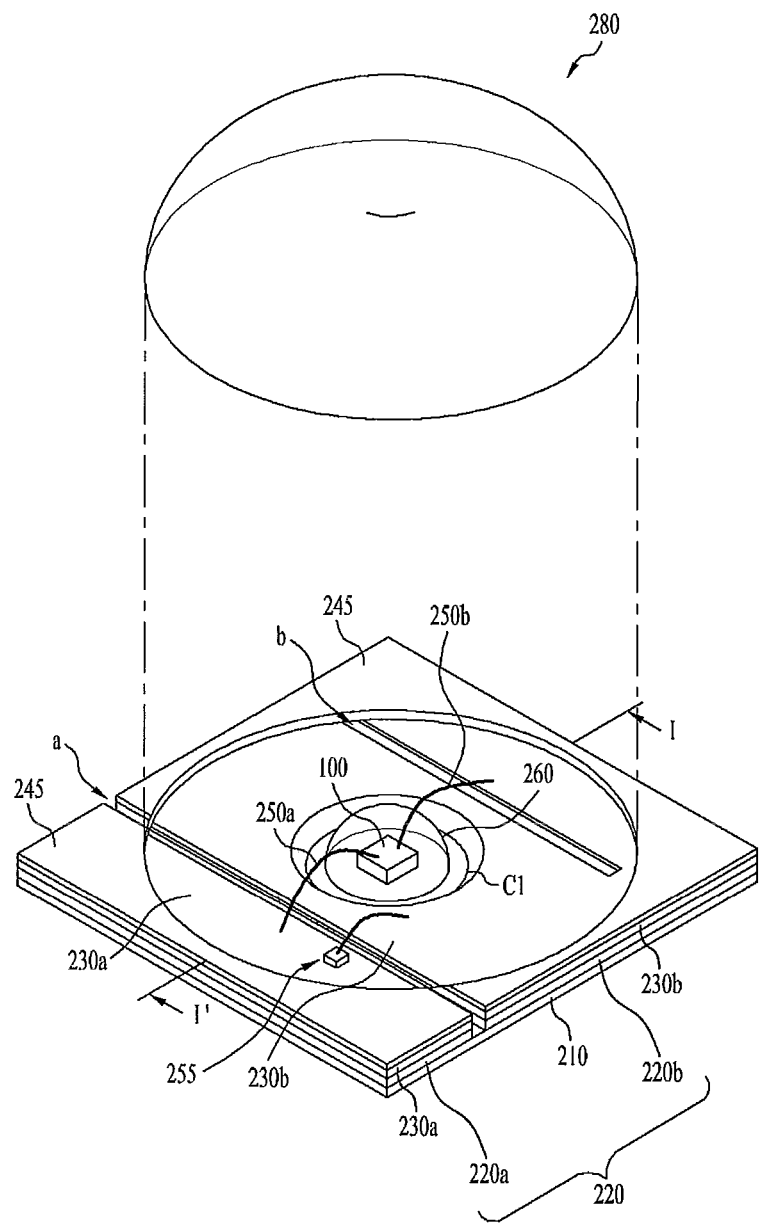
FIG. 21 illustrates an exploded perspective view of the light emitting device package in FIG. 20.

FIG. 20 illustrates a section of a light emitting device package in accordance with a third embodiment, and FIG. 21 illustrates an exploded perspective view of the light emitting device package in FIG. 20.

Referring to FIG. 20, the light emitting device package may include first lead frame 220a and second lead frame 220b spaced from each other, a concave part C disposed at a region of the second lead frame 220b, a light emitting device 100 disposed in the concave part C of the second lead frame 220b, a reflective layer 230a, 230b disposed on the first lead frame 220a and the second lead frame 220b, a resin layer 250 disposed on the light emitting device 100 at the concave part C of the second lead frame 220b to include a fluorescent material, a lens 280 on the resin layer 250 and the reflective layer 220, a polymer protective film 245 disposed on an underside of an edge of the lens 280, and an insulating layer 210 on an underside of the first lead frame 220a and the second lead frame 220b.

The polymer protective film 245 may include, but not limited to, solder resist. For an example, the polymer protective film 245 may include, but not limited to, PSR (Photo Solder Resist) or white solder resist.

The concave part C of the second lead frame 220b may be, but not limited to, a down-set region or a bend region at a region of the second lead frame 220b.

According to the embodiment, by forming the concave part C at the second lead frame 220b with down-set, and mounting the light emitting device 100 thereon, structural stability can be enhanced.

And, according to the embodiment, by forming the concave part C at the second lead frame 220b, mounting the light emitting device 100 thereon, and forming the resin layer 250 including a fluorescent material thereon, enabling to form an encapsulation including the fluorescent material in a dome shape, a uniform color temperature can be displayed enabling to improve color deviation.

For an example, since the embodiment can reduce an area of the fluorescent material by dotting the fluorescent material on the light emitting device 100 smaller than a system in which the fluorescent material is filled in an existing cup, the color deviation can be reduced to reduce Mura as well as a thickness of a set can be reduced.

And, according to the embodiment, the mounting of the light emitting diode on the concave part C of the second lead frame 220b, making a seating position of the light emitting device 100 lower enabling to minimize influence of thermal stress, permits to reduce yellow ring caused by the thermal stress.

And, since the embodiment has a groove H formed in the concave part C of the second lead frame 220b at a periphery of the resin layer 250, enabling to form the resin layer 250 including the fluorescent material in the dome shape, the color deviation can be reduced.

In the embodiment, the first lead frame 220a and the second lead frame 220b may be separate electrically by a spaced portion a, and a pass-through portion b disposed at the second lead frame 220b in symmetry to the spaced portion a makes the second lead frame 220b stable to the thermal stress.

The light emitting device 100 may be mounted to a mounting area of the concave part C with a die adhesive (Not shown), such as silicone epoxy, disposed thereon.

The light emitting device 100 may be connected to the reflective layer 230a, 230b with a wire. For an example, the light emitting device 100 may be connected to the first reflective layer 230a with the first wire 250a, and to the second reflective layer 230b with the second wire 250b.

The embodiment intends to provide a light emitting device package and a lighting system of which reliability is improved.

Therefore, in the embodiment, the polymer protective film 245 is disposed on the underside of the periphery of the lens 280, enhancing coupling force between the lens 280 and the reflective layer 230a, 230b to enhance a sealing quality of a side portion of the lens, preventing infiltration of moisture thereto to prevent discoloring of the lead frame 220 and die adhesive, thereby increasing luminous efficiency to provide a light emitting device package and a lighting system of which reliability is improved.

And, according to the embodiment, the suppression of the deformation of the lens caused by the thermal stress with the polymer protective film 245 disposed on an underside of the periphery of the lens 280 preventing delamination of the lens to enhance a sealing quality of the moisture infiltration permits to provide a light emitting device package and a lighting system of which reliability is improved.

Eventually, the embodiment can improve reliability enabling to provide a light emitting device package and a lighting system of which luminous efficiency is improved.

In the first embodiment, the polymer protective film 245 may be disposed between the reflective layer 230a, 230b and the lens 280. For an example, the polymer protective film 245 may be disposed at the periphery of the reflective layer 230a, 230b, and the polymer protective film 245 may have a circular inner side in conformity with a shape of the lens 280, but not limited to this. The polymer protective film 245 may be disposed at a region matched to an underside of the periphery of the lens 280.

The underside of the periphery of the lens 280 may be disposed to overlap with a portion of the polymer protective film 245. According to this, a diameter of the periphery of the lens 280 may be larger than a diameter of the inner side of the polymer protective film 245, but not limited to this.

The embodiment can provide a light emitting device package and a lighting system of which reliability is improved by providing the polymer protective film 245 at the periphery of the reflective layer 230a, 230b and the underside of the periphery of the lens 280 to increase coupling force between the lens 280 and the reflective layer 230a, 230b to enhance a sealing quality of the side portion of the lens to prevent moisture from infiltrating to increase luminous efficiency.

And, according to the embodiment, the prevention of the delamination with the polymer protective film 245 at the periphery of the reflective layer 230a, 230b and the underside of the periphery of the lens 280, enhancing a sealing quality against moisture infiltration permits to provide a light emitting device package and a lighting system of which reliability is improved.

Figure 22:
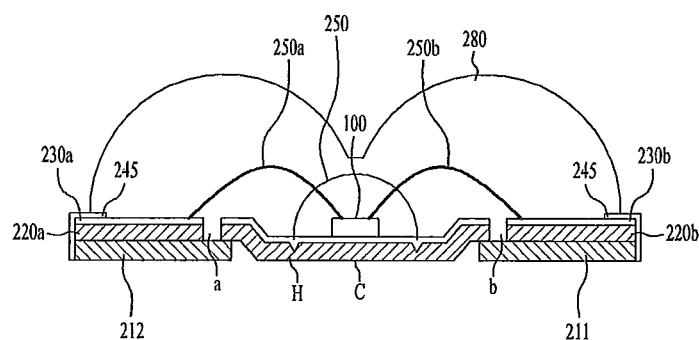
FIG. 22 illustrates a section of a light emitting device package in accordance with a fourth embodiment.

FIG. 22 illustrates a section of a light emitting device package in accordance with a fourth embodiment. The light emitting device package in accordance with a fourth embodiment may have technical features of the third embodiment applied thereto.

In the embodiment, the polymer protective film 245 may be disposed between the reflective layer 230a, 230b and the lens 280 and sides of the reflective layer 230a, 230b and the insulating layer 210.

In the embodiment, by forming the polymer protective film 245 between the reflective layer 230a, 230b and the lens 280 and sides of the reflective layer 230a, 230b and the insulating layer 210, a moisture infiltration passage at the side of the periphery of the lens 280 is blocked, as well as coupling force between the lens 280 and the reflective layer 230a, 230b is increased, to enhance a sealing quality of the side of the lens to prevent the moisture from infiltrating, increasing luminous efficiency, thereby providing a light emitting device package and a lighting system of which reliability is improved.

And, according to the embodiment, the prevention of the delamination of the lens with the polymer protective film 245 disposed at the periphery of the reflective layer 230a, 230b and the underside of the periphery of the lens 280, enhancing a sealing quality against moisture infiltration permits to provide a light emitting device package and a lighting system of which reliability is improved.

Figure 23:
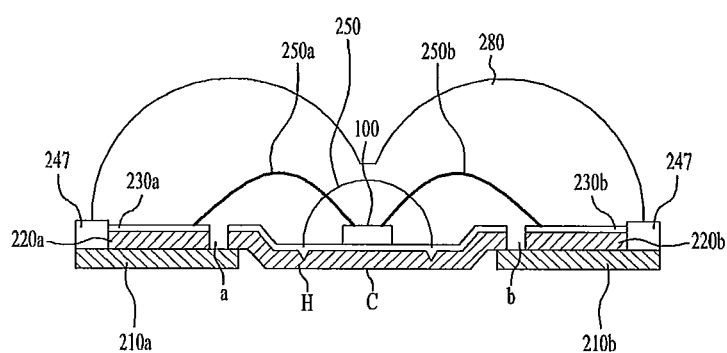
FIG. 23 illustrates a section of a light emitting device package in accordance with a fifth embodiment.

FIG. 23 illustrates a section of a light emitting device package in accordance with a fifth embodiment.

The light emitting device package in accordance with the fifth embodiment may have technical features of the third or fourth embodiment applied thereto.

In the embodiment, the polymer protective film 247 may be disposed between the insulating layer 210 and the lens 280.

In the third embodiment, the polymer protective film 247 may be disposed to be in contact both with an underlying insulating layer 210, and an overlying lens 280, to improve poor coupling force between the lens 280 and the reflective layer 230a, 230b to enhance the reliability.

In the third embodiment, though the first lead frame 221a and the second lead frame 222b, the first reflective layer 230a and the second reflective layer 230b may be disposed to have widths smaller than a horizontal width of the lens 280, but not limited to this. Accordingly, the polymer protective film 247 may be disposed such that an underside of the polymer protective film 247 is in contact with the insulating layer 210, and an upper side of the polymer protective film 247 is in contact with the lens 280, but not limited to this.

While describing the steps of a method for fabricating a light emitting device package in accordance with an embodiment with reference to FIGS. 24 to 33, characteristics of the embodiment will be described in more detail. Though FIGS. 24 to 33 describe centered on a sectional drawing of a process for fabricating the light emitting device package in accordance with a third embodiment, but embodiments are not limited to this.

A method for forming a lead frame having a concave part C will be described with reference to FIGS. 24 to 30.

Figure 24:
FIGS. 24 to 33 illustrate sections showing the steps of a method for fabricating a light emitting device package in accordance with an embodiment.
Figure 25:
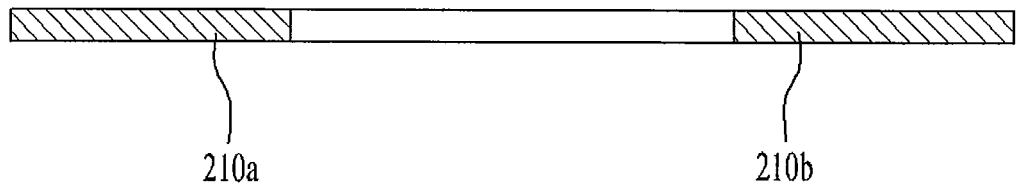

Referring to FIG. 24, an insulating film 210 is provided, and as shown in FIG. 25, an insulating layer 210a, 210b is formed. The insulating layer 210a, 210b may be formed by, but not limited to, punching.

The insulating layer 210a, 210b may include a first insulating layer 210a and a second insulating layer 210b respectively attached to undersides of a first lead frame 220a and a second lead frame 220b formed later, and the insulating layer serves to maintain a gap between the two lead frames and to support and securing the two adjacent lead frames.

The insulating layer 210 covers adjacent spaced portion a and a pass through portion b, and in this case, the insulating layer 210 can prevent liquid resin from leaking through the spaced portion a and the pass through portion b in a process the resin layer 250 is disposed.

The insulating layer may include a translucent or non-translucent film, for an example, a PI film, a PET film, an EVA film, a PEN film, a TAC film, a PAI film, a PEEK film, PFA, PPS, or resin film (PE, PP, or PET).

Figure 26:
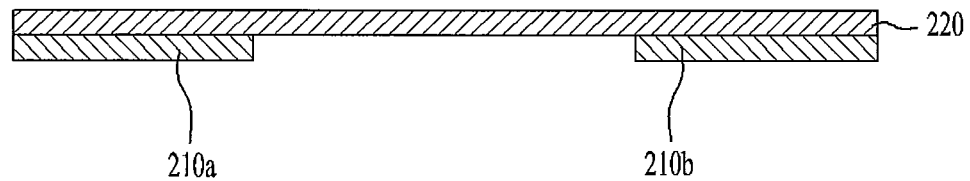

Next, referring to FIG. 26, a lead frame 220 is disposed on the insulating layer 210. For an example, the lead frame 220 may be formed of, but not limited to, an alloy including copper Cu, such as Cu—Ni, Cu—Mg—Sn, an alloy including iron Fe, such as Fe—Ni, or aluminum Al or an alloy including aluminum.

Each of the first lead frame 220a and the second lead frame 220b may be disposed at a thickness in a range of 15 μm~300 μm, preferably in a range of 15 μm~35 μm for supporting the light emitting device, and serving as a heat dissipation member to transfer heat from the light emitting device.

Figure 27:
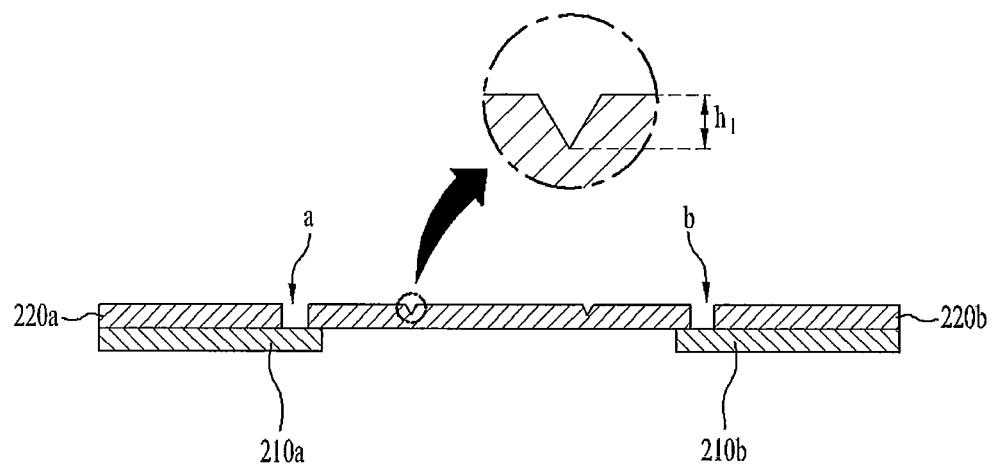

Referring to FIG. 27, the lead frame 220 may be separated into a first lead frame 220a and a second lead frame 220b by etching.

In the embodiment, the first lead frame 220a and the second lead frame 220b may be separated by the spaced portion a electrically, and as the pass through portion b is disposed symmetry to the spaced portion a with respect to the second lead frame 220b, the second lead frame 220b may be stable to thermal stress. The spaced portion a and the pass through portion b may be formed in the etching of the lead frame, described before.

The embodiment can reduce color deviation by forming a groove H in the second lead frame 220b corresponding to a periphery of the resin layer, which will be formed later, to form the resin layer 250 including a fluorescent material in a shape of a dome. The depth ($h_1$) of the groove H is a third part (⅓) to two third parts (⅔) of a thickness of the first lead frame 220a and the second lead frame 220b.

The groove H in the second lead frame 220b may be formed, but not limited to, by half etching not to pass through the second lead frame 220b.

Figure 28:
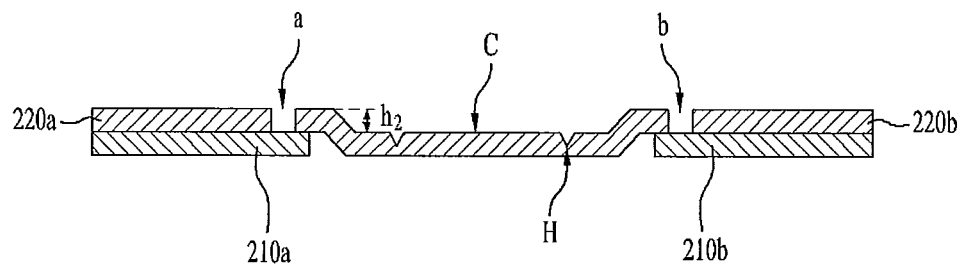
Figure 29:
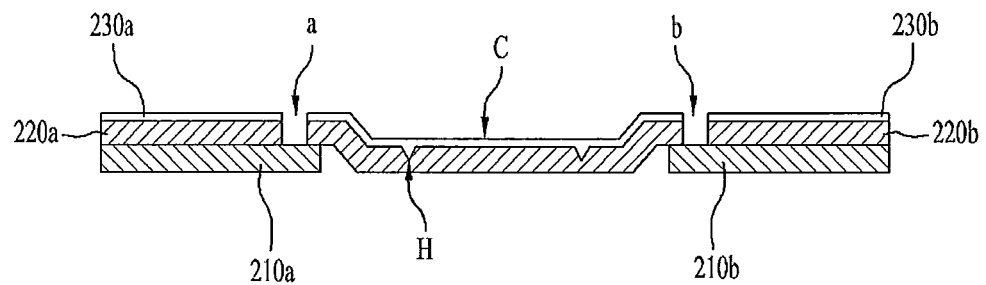
Figure 30:
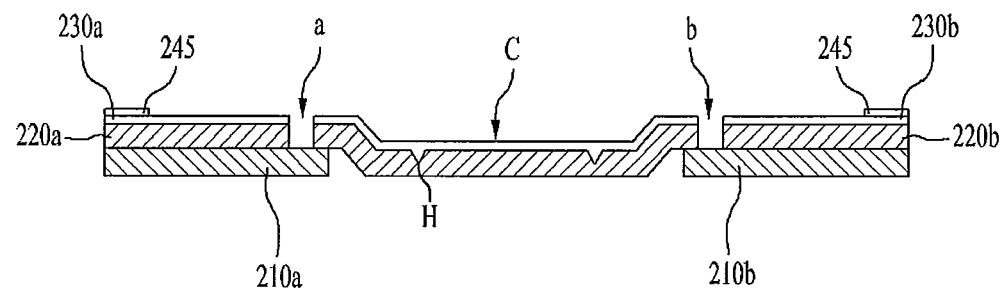

Referring to FIG. 28, a concave part C is disposed at the second lead frame 220b. The concave part C may be formed by, but not limited to, down-set or punching at a region of the second lead frame 220b. In the embodiment, the concave part C is formed by down-set of the second lead frame 220b, and the light emitting device is mounted thereto for enhancing structural stability.

The depth $h_2$ of the first concave part Cl may be equal to the thickness of the insulating layer 210a and 210b, or may be 90% to 110% of the insulating layer 210a and 210b.

And, in the embodiment, by forming the concave part C on the second lead frame 220b, mounting the light emitting device, and forming the resin layer 250, encapsulation including fluorescent material can be disposed in a dome shape, enabling to enhance the structural stability.

Then, referring to FIG. 10, a reflective layer 230a, 230b may be disposed on the first lead frame 220a and the second lead frame 220b. The reflective layer 230a, 230b may include a first reflective layer 230a on the first lead frame 220a, and a second lead frame 230b on the second lead frame 220b.

The reflective layer 230a, 230b may be formed of, but not limited to, silver Ag, nickel Ni, aluminum Al, or an alloy thereof.

And, referring to FIG. 11, a polymer protective film 245 may be disposed at a periphery of the reflective layer 230a, 230b.

For an example, referring to FIG. 20, in the third embodiment, the polymer protective film 245 may be between the reflective layer 230a, 230b and the lens 280. For an example, the polymer protective film 245 may be disposed on the periphery of the reflective layer 230a, 230b, and an inner side of the polymer protective film 245 may be, but not limited to, circular in conformity with a shape of the lens 280. The polymer protective film 245 may be disposed on an underside of a periphery of the lens 280.

According to the third embodiment, by providing the polymer protective film 245 between the reflective layer 230a, 230b and the lens 280, to increase coupling force between the reflective layer 230a, 230b and the lens 280 increasing the sealing quality at the side portion of the lens to prevent moisture from infiltrating, preventing the first, and second lead frames 220a, and 220b and the die adhesive from discoloring, to increase luminous efficiency, a light emitting device package and a lighting system of which reliability is improved can be provided.

And, according to the embodiment, the suppression of deformation of the lens caused by thermal stress with the polymer protective film 245 disposed on the underside of the periphery of the lens 280 prevents delamination of the lens to enhance a sealing quality against moisture infiltration, thereby enabling to provide a light emitting device package and a lighting system of which reliability is improved.

And, for an example, referring to FIG. 22, in the fourth embodiment, the polymer protective film 246 may be disposed between the reflective layer 230a, 230b and the lens 280, and at sides of the reflective layer 230a, 230b and the insulating layer 210.

According to the fourth embodiment, the formation of the polymer protective film 246 between the reflective layer 230a, 230b and the lens 280, and at sides of the reflective layer 230a, 230b and the insulating layer 210 blocks a moisture infiltration passage at the side of the periphery of the lens 280 as well as increases coupling force between the lens 280 and the reflective layer 230a, 230b to increase a sealing quality of a side portion of the lens to prevent moisture from infiltrating to increase luminous efficiency, thereby enabling to provide a light emitting device package and a lighting system of which reliability is improved.

The prevention of delamination of the lens by forming the polymer protective film 246 between the reflective layer 230a, 230b and the lens 280, and at sides of the reflective layer 230a, 230b and the insulating layer 210 increasing a sealing quality against moisture infiltration permits to provide a light emitting device package and a lighting system of which reliability is improved.

In a fifth embodiment of a light emitting device package illustrated in FIG. 23, the polymer protective film 246 may be provided between the insulating layer 210 and the lens 280.

In the embodiment, the polymer protective film 247 may be disposed in contact both with an underlying insulating layer 210 and an overlying lens 280, thereby improving coupling force between the lens 280 and the reflecting layer 230a, 230b to enhance a sealing quality of the side portion to improve reliability.

In the embodiment, though the first lead frame 220a, the second lead frame 220a, the first reflecting layer 230a, and the second reflecting layer 230bb may be disposed, but not limited to, smaller than a horizontal width of the lens 280.

According to this, in the embodiment, the improvement of reliability permits to provide a light emitting device package and a lighting system of which luminous efficiency improved.

Figure 31:
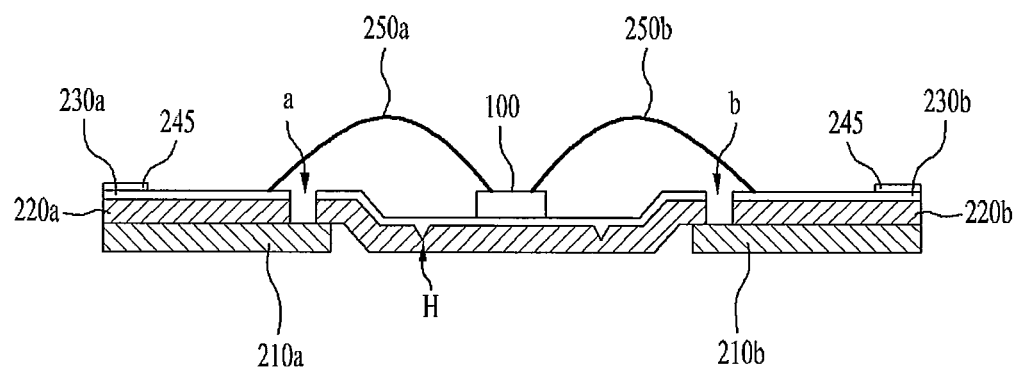

Next, referring to FIG. 31, the light emitting device 100 is mounted to the concave part C of the second lead frame 220b. For an example, after forming a die adhesive (Not shown) of silicon epoxy or the like at a mounting area of the concave part C, the light emitting device 100 may be mounted thereto.

Then, the light emitting device 100 may be connected to the first lead frame 220a with the first wire 250a electrically, and to the second lead frame 220b with the second wire 250b.

In the embodiment, the low seating position of the light emitting device owing to mounting of the light emitting device to the concave part C disposed at the lead frame 220, enabling to lowering a height of the wire at the time of wire bonding minimizing influence of thermal stress, thereby improving yellow ring caused by the thermal stress.

Figure 32:
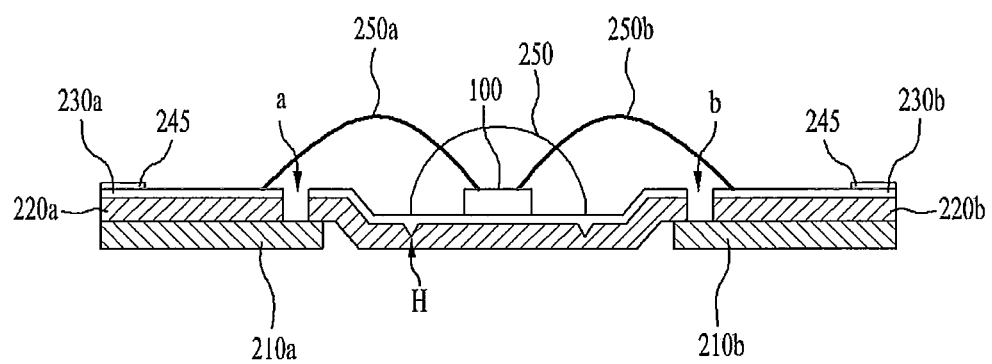

And, referring to FIG. 32, a resin layer 250 including a fluorescent material is disposed on the light emitting device 100 at the concave part C of the second lead frame 220b.

According to the embodiment, the mounting of the light emitting device 100 and the formation of the resin layer 250 including a fluorescent material after formation of the concave part C at the second lead frame 220b, enabling to form a dome shaped encapsulation, permits to display a uniform color temperature to improve a color deviation.

The embodiments can reduce MURA and a thickness of a set by dotting a fluorescent material to reduce an area of the fluorescent material smaller than a system in which the fluorescent material is filled in an existing cup.

Figure 33:
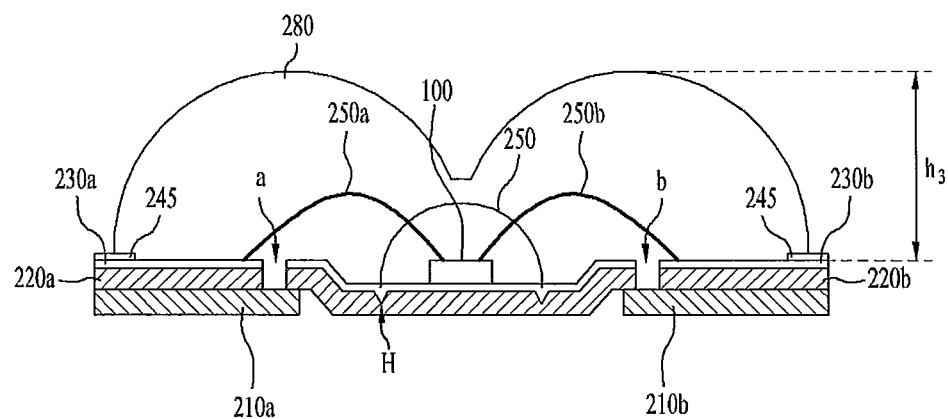

And, referring to FIG. 33, a lens 280 is disposed on the resin layer 250 and the lead frame 220. A height $h_3$ of the lens 280 is higher than that of the light emitting device 100, and may be 1.4 mm to 1.7 mm.

In the embodiment, the lens 280 may have a recessed center portion and circular periphery. The lens 280 may be formed of a material having properties similar to a material of the resin layer 250 for minimizing a thermal expansion stress caused by the thermal stress. For an example, the lens 280 may be formed of, but not limited to, silicone.

An array of the light emitting device packages of the embodiment may be on a substrate, and a light guide plate, a prism sheet, a diffusion sheet, and the like that are optical members may be disposed on a light path of the light emitting device package. The light emitting device package, the substrate, and the optical members may function as a lighting unit. As another embodiment, a display device, an indicating device, or a lighting system may be produced, which includes the semiconductor light emitting device or the light emitting device package described in the foregoing embodiments, and the lighting system may include, for an example, a lamp or a street light.

A lighting device and a backlight unit will be described as one embodiment of the light system having the foregoing light emitting device package disposed thereto will be described.

Figure 34:
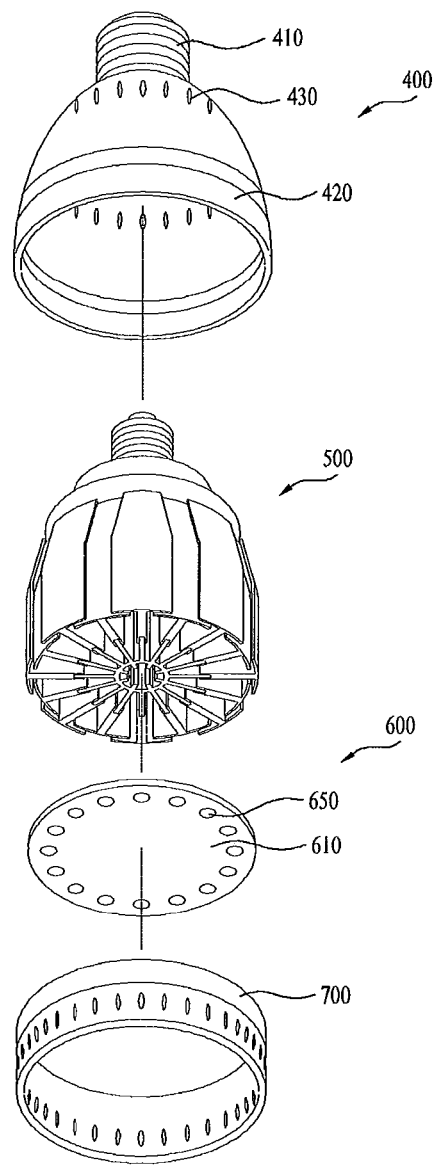
FIG. 34 illustrates an exploded perspective view of a lighting device in accordance with one embodiment, having one of the light emitting device packages applied thereto.

FIG. 34 illustrates an exploded perspective view of a lighting device having a light emitting device package in accordance with an embodiment of the present invention applied thereto.

Referring to FIG. 34, the lighting device includes a light source 600 for projecting a light, a housing 400 for housing the light source 600, a heat dissipating unit 500 for dissipating heat from the light source 600, and a holder 700 for fastening the light source 600 and the heat dissipating unit 500 to the housing 400.

The housing 400 includes a socket fastening portion 410 for fastening the housing 400 to an electric socket (Not shown) and a body portion 420 connected to the socket fastening portion for housing the light source 600. The body portion 420 may have an air flow opening 720 passing there through.

The body portion 420 of the housing 400 has a plurality of air flow openings 430. The air flow opening 430 may be singular or plural disposed, but not limited to, radially as shown in the drawing.

The light source 600 has a plurality of the light emitting device packages 650 provided on a circuit board 610. The circuit board 754 may have a shape that may be placed in an opening of the housing 400, and, as described before, the light emitting device package 650 is thin and a good heat dissipation characteristic.

And, the holder 700 is provided under the light source, including a frame and another air flow openings. Though not shown, an optical member may be provided to under the light source 600 for causing the light from the light emitting device package 150 of the light source 600 to diverge, scatter, or converge.

Figure 35:
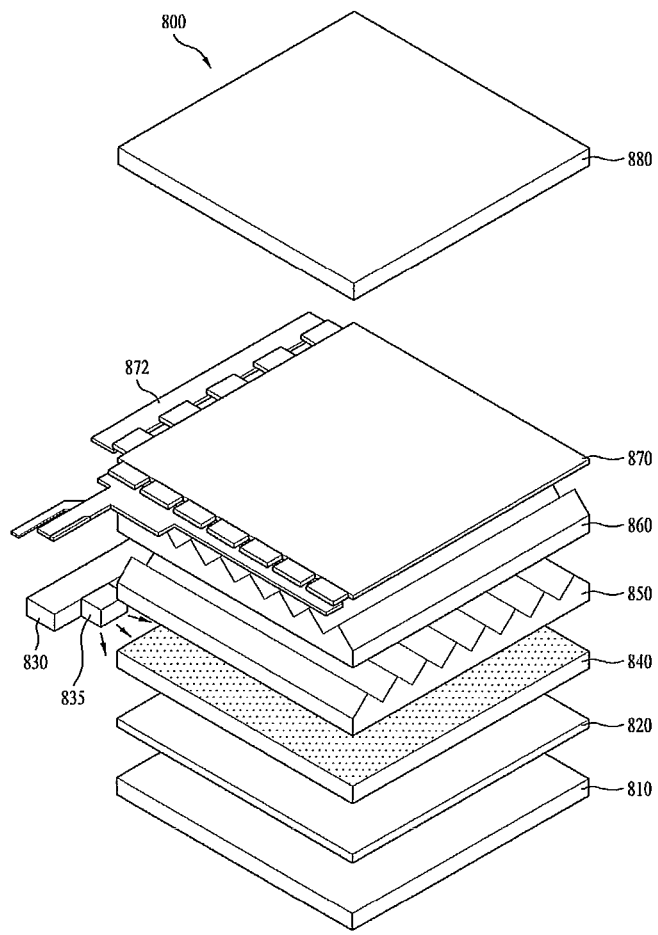
FIG. 35 illustrates a perspective view of an image display device in accordance with one embodiment, having the foregoing light emitting device package applied thereto.

FIG. 35 illustrates an exploded perspective view of an image display device in accordance with one embodiment, having the foregoing light emitting device package applied thereto.

Referring to FIG. 35, the image display device 800 includes a bottom cover 810, a reflective plate 820 on the bottom cover 810, a light source module for emitting a light, a light guide plate 840 disposed in front of the reflective plate 820 for guiding the light from the light source module 830 and 835 to a front of the image display device, optical sheets including prism sheets 850 and 860 disposed in front of the light guide plate 840, a display panel 870 disposed in front of the optical sheets, a picture signal forwarding circuit 872 connected to the display panel 870 for supplying a picture signal to the display panel 870, and a color filter 880 disposed in front of the display panel 870. In this instance, the bottom cover 810, the reflective plate 820, the light source module 830 and 835, the light guide plate 840, and the optical sheets may construe a backlight unit.

The light source module includes a light emitting device package 835 on a substrate 830. In this instance, the substrate 830 may be a PCB or the like.

The bottom cover 810 may accommodate elements of the image display device 800. And, the reflective plate 820 may be an individual element as shown in the drawing, or may be a coat of a material with a high reflectivity on a rear of the light guide plate 840 or on a front of the bottom cover 810.

In this instance, the reflective plate 820 may be formed of a material which has high reflectivity and can form a micron-film, such as PET (PolyEthylene Terephtalate).

And, the light guide plate 840 scatters the light from the light source module for uniform distribution of the light to an entire region of a screen of the liquid crystal display panel. Accordingly, the light guide plate 830 is formed of a material having good refractivity and transmissivity, such as PolyMethylMethAcrylate PMMA, PolyCarbonate PC, PolyEthylene PE, or injection molded resin. And, the light guide plate 840 may be omitted to take an air guide system in which the light transmits through air over the reflective plate 820.

And, the first prism sheet 850 may be formed of a polymer having light transmissivity and elasticity on one side of a supporting film. The polymer may have a prism layer with a plurality of three dimensional structures disposed thereon, repeatedly. In this instance, as shown, the plurality of patterns may be a stripe type with repetitive ridges and grooves.

And, a direction of the ridges and the grooves in the second prism sheet 860 may be perpendicular to a direction of the ridges and the grooves in the first prism sheet 850, for uniform distribution of the light from the light source module and the reflective sheet to an entire surface of the display panel 870.

And, though not shown, each of the prism sheets may have a protective sheet provided thereon by providing a protective layer having light diffusing particles and a binder on both sides of the supporting film. And, the prism layer may be formed of a polymer material selected from a group including polyurethane, styrene butadiene copolymer, polyacrylate, polymethacrylate, polymethylmethacrylate, polyethyleneterephthalate elastomer, polyisoprene, and polysilicone.

And, though not shown, a diffusion sheet may be disposed between the light guide plate 840 and the first prism sheet 850. The diffusion sheet may be formed of a material selected from a polyester group and a polycarbonate group, for widening a light projection angle to the maximum by refraction and scattering of the light from the backlight unit. And, the diffusion sheet may include a supporting layer having light diffuser contained therein, and a first layer and a second layer both without the light diffuser contained therein disposed on a light forwarding surface (a first prism sheet direction) and a light incident surface (a reflective sheet direction), respectively.

In the embodiment, the diffusion sheet, the first prism sheet 850 and the second prism sheet 860 construe the optical sheet. The optical sheet may be constructed of other combination, for an example, a microlens array, a combination of the diffusion sheet and the microlens array, a combination of one prism sheet and the microlens array, or so on.

As the display panel 870, a liquid crystal panel may be applied, and besides the liquid crystal panel 860, other kind of image display device which requires a light source may be applied. The display panel 870 has liquid crystals disposed between glass panels, and a polarizing plate placed on both of the glass panels for utilizing polarizability of a light. The liquid crystals have intermediate characteristics of liquid and solid, in which the liquid crystals, organic molecules with fluidity like the liquid, are disposed regularly like crystal. By utilizing a property of the liquid crystals in which a molecular arrangement varies with an external electric field, a picture is displayed.

The liquid crystal panel used in the image display device has an active matrix system, in which a transistor is used as a switch for controlling a voltage supplied to pixels. And, the liquid crystal panel 870 has a color filter 880 on a front for each of pixels to transmit only red, green and blue lights of the light from the panel 870, thereby displaying a picture.

Figure 36:
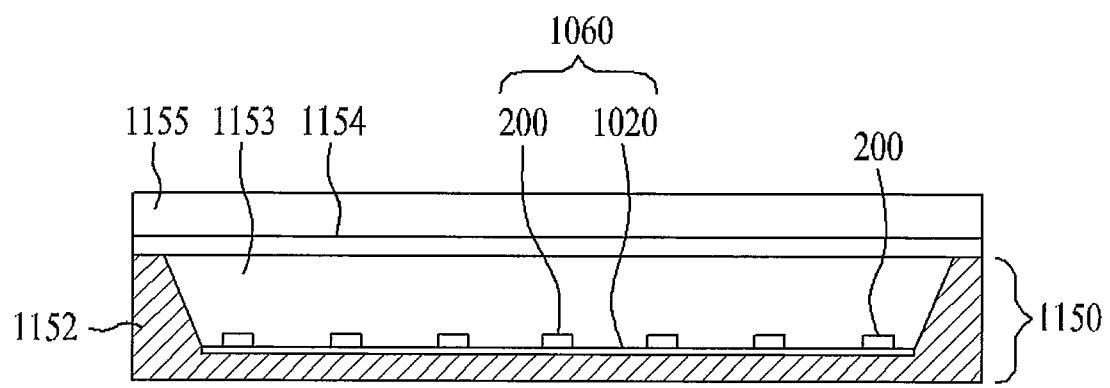
FIG. 36 illustrates a section of an image display device in accordance with another embodiment, having the foregoing light emitting device package applied thereto.

FIG. 36 illustrates a section of an image display device in accordance with another embodiment, having the foregoing light emitting device package applied thereto.

Referring to FIG. 36, the image display device includes a bottom cover 1152, a substrate 1020 having an array of the light emitting device packages 200 disclosed herein mounted thereon, an optical member 1154, and a display panel 1155. As the light emitting device packages 200, light emitting device packages 202 in accordance with another embodiment may be employed.

The substrate 1020 and the light emitting device packages 200 may be defined as a light emitting device module 1060, collectively. The bottom cover 1152, at least one light emitting device module 1060, and the optical member 1154 may be defined as a lighting unit, collectively.

The bottom cover 1152 may have an accommodating portion 1153, but the embodiment does not confine this.

The optical member 1154 may include at least one of a lens, a light guide plate, a diffusion sheet, horizontal and vertical prism sheets, and a brightness enhancing sheet. The light guide plate may be formed of PC or PMMA (Poly methyl methacrylate), but the light guide plate may be omitted. The diffusion sheet diffuses a light incident thereon, and the horizontal and vertical prism sheets make the light incident thereon to converge onto a display region, and brightness enhancing sheet returns the light being losing to improve brightness.

The optical member 1154 is disposed on the light emitting device module 1060 for turning the light from the light emitting device module 1060 into a surface light source, or making the light to diverge, or converge.

The foregoing embodiments can provide a light emitting device package and a lighting system which can improve a color deviation.

For an example, the embodiments can reduce MURA and a thickness of a set by dotting a fluorescent material to reduce an area of the fluorescent material smaller than a system in which the fluorescent material is filled in an existing cup.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   an insulating layer;
   a first lead frame and a second lead frame disposed above the insulating layer electrically separate from each other;
   a light emitting device disposed above the second lead frame electrically connected to the first lead frame and the second lead frame, the light emitting device includes a light emitting structure having a first conduction type semiconductor layer, an active layer, and a second conduction type semiconductor layer; and
   a lens disposed above the light emitting device,
   wherein the insulating layer has an end portion projected outside of at least one of an end portion of the first lead frame or an end portion of the second lead frame,
   wherein an edge of the lens is disposed on an opened region of the insulating layer, and wherein the edge of the lens is in direct contact with the first lead frame, the second lead frame and the opened region of the insulating layer.

2. The light emitting device package as claimed in claim 1, wherein the insulating layer is projected 90 μm to 110 μm from at least one of the end portion of the first lead frame or the end portion of the second lead frame.

3. The light emitting device package as claimed in claim 1, further comprising a reflective layer disposed on at least one of the first lead frame or the second lead frame.

4. The light emitting device package as claimed in claim 1, wherein the insulating layer comprises at least one of polyimide or PPA.

5. The light emitting device package as claimed in claim 1, wherein the second lead frame has a concave part disposed at a region having the light emitting device disposed thereto.

6. A light emitting device package comprising:
an insulating layer;
a first lead frame and a second lead frame disposed above the insulating layer electrically separated from each other;
a light emitting device disposed above the second lead frame electrically connected to the first lead frame and the second lead frame, the light emitting device includes a light emitting structure having a first conduction type semiconductor layer, an active layer, and a second conduction type semiconductor layer;
a resin layer disposed above the light emitting device, the resin layer including a fluorescent material;
a lens disposed above the resin layer; and
a polymer protective film disposed on the first lead frame and the second lead frame,
wherein the polymer protective film is in direct contact with the lens and in indirect contact with the insulating layer.

7. The light emitting device package as claimed in claim 6, further comprising a reflective layer disposed on the first lead frame and the second lead frame, and the polymer protective film is disposed between the reflective layer and the lens.

8. The light emitting device package as claimed in claim 7, wherein the polymer protective film is in direct contact with at least one side of the reflective layer.

9. The light emitting device package as claimed in claim 6, wherein the polymer protective film is disposed between at least one of the first lead frame or the second lead frame on the insulating layer and the lens.

10. The light emitting device package as claimed in claim 6, wherein the polymer protective film includes at least one of solder resist or PPA.

11. The light emitting device package as claimed in claim 6, further comprising a concave part disposed on the second lead frame, and the light emitting device is disposed on the concave part.

12. The light emitting device package as claimed in claim 11, wherein the concave part does not overlap with the insulating layer,
wherein the concave part is formed on a first portion of the second lead frame, and
wherein the insulating layer supports a second portion of the second lead frame.

13. The light emitting device package as claimed in claim 11, wherein the concave part is a down-set region of the second lead frame.

14. The light emitting device package as claimed in claim 12, further comprising a groove disposed on the second lead frame around the light emitting device, and an edge of the resin layer is disposed at the groove.

15. The light emitting device package as claimed in claim 1, wherein the lens covers interfaces between the insulating layer and at least one of the first lead frame or the second lead frame.

16. The light emitting device package as claimed in claim 1, wherein the end portion of at least one of the insulating layer, the first lead frame and the second lead frame is rounded.

17. The light emitting device package as claimed in claim 1, wherein the light emitting device is electrically connected to the first lead frame and the second lead frame by wires, and a portion of the wires is covered by the lens.

18. The light emitting device package as claimed in claim 8, wherein the polymer protective film covers interfaces between the lens and at least one of the first lead frame or the second lead frame.

19. The light emitting device package as claimed in claim 6, wherein the light emitting device is electrically connected to the first lead frame and the second lead frame by wires, and a portion of the wires is covered by the lens.

* * * * *